United States Patent
Lin et al.

(10) Patent No.: US 6,211,060 B1
(45) Date of Patent: Apr. 3, 2001

(54) METHOD FOR PLANARIZING A DAMASCENE STRUCTURE

(75) Inventors: Tsang-Jung Lin, Chungli; Tsung-Lin Lu, Tainan Hsien, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/215,591

(22) Filed: Dec. 17, 1998

(30) Foreign Application Priority Data

Aug. 18, 1998 (TW) .................................................. 87113558

(51) Int. Cl.⁷ ................................................ H01L 21/4763
(52) U.S. Cl. ........................... 438/622; 438/618; 438/626
(58) Field of Search ..................................... 438/633, 634, 438/618, 622, 626

(56) References Cited

U.S. PATENT DOCUMENTS

| | | | |
|---|---|---|---|
| 5,256,565 | * 10/1993 | Bernhardt et al. | 437/228 |
| 5,516,729 | * 5/1996 | Dawson | 438/63 |
| 5,663,102 | * 9/1997 | Park | 438/633 |

* cited by examiner

*Primary Examiner*—Matthew Smith
*Assistant Examiner*—Craig P Lytle
(74) *Attorney, Agent, or Firm*—Jiawei Huang; J. C. Patents

(57) ABSTRACT

A method for planarizing a damascence structure, comprises using two polishing procedure to remove the redundant metal layer. The method comprises depositing a dielectric layer over a wafer. A photolithography and etching procedure is then performed to form trenchs on the dielectric layer. Then, a metal layer is deposited over the dielectric layer and fills the trenchs. Thereafter, a electrical polishing and chemical mechanical polishing method is performed to remove metal layer until the dielectric layer is exposed. The invention is capable of reducing the dishing and erosion effects occurred on the metal layer.

7 Claims, 3 Drawing Sheets

METHOD FOR PLANARIZING A DAMASCENE STRUCTURE

CROSS-REFERENCE TO RELATED APPLICATION

This application claims the priority benefit of Taiwan application serial no. 87113558, filed Aug. 18, 1998, the full disclosure of which is incorporated herein by reference.

BACKGROUND OF THE INVENTION

1. Field of the Invention

This invention relates in general to a method for planarizing a damascene structure, and more particularly to a planarization method with the combination of an electrical polishing method and a chemical mechanical polishing method to decrease the occurrence of dishing and erosion effects.

2. Background

As the level of integration for integrated circuits increases, the amount of yield, cost and reliability necessary for semiconductor devices increases, too. Damascene processing method is invented due to these requirements. The method is capable of applying to the manufacturing processes of interconnect, via opening and contact opening to displace the conventional metal process, such as using a reactive ion etching method to etch CMOS and logic memory.

FIGS. 1A to 1B are cross-sectional views showing the conventional planarization steps of a damascene structure.

As shown in FIG. 1A, using a step of photolithography and etching with the etching time controlled, a trench 14 is formed on the dielectric layer 10. A metal layer 12 is then formed on the dielectric layer and fills the trench 14.

As shown in FIG. 1B, a chemical mechanical polishing method is used for polishing wafer to remain the metal layer 12 within the trench 14. The dielectric layer 10 is utilized as a polishing stop layer during the polishing step by using slurry having high polish selectivity to the metal layer 12.

The key point of damascence process is the optimization of the chemical mechanical polishing process, especially when the thickness and flatness of the metal layer are controlled by the chemical mechanical polishing process. Dishing effect is occurred on the conductive material layer, for example, tungsten metal, during the chemical mechanical polishing process. Moreover, step height effect is occurred after the depositing step of the conductive material over the dielectric layer and the trench. That is, the height of the conductive layer, for example, metal layer, deposited over the trench is lower than that of the conductive layer deposited over the dielectric layer.

Slurry is composed of polishing particles and chemical enhance reagents. Some particles are deposited on the dishing portions of the metal layer. The polishing speed of the dishing portions are higher than that of other portions, hence the dishing effect become more seriously. Further, additional polishing, for example, over-polishing, is needed after the dielectric layer is exposed to ensure the metal layer over the dielectric layer is removed. Therefore, the metal layer is further polished and dishing effect is occurred.

Erosion effect is another problem of the chemical mechanical polishing process. If there are no enough oxide material used as a stop layer, the erosion effect is occurred. As the polishing process goes on, the oxide layer becomes much thinner. Therefore, the conductive material layer formed under the stop layer is over polished. It makes the thickness of the conductive material layer not enough. Erosion effect is easily occurred, especially on the conductive material layer having high integration and scantily oxide layer formed thereon.

This operation is carried out under suitable controlling parameter settings to obtain the best planarity. However, the list of controlling parameters is long and includes the composition of the slurry, the pressure exerted on the silicon wafer, the rotating speed and composition of the polishing pad, as well as the distribution, temperature, and pH of the polishing particles.

SUMMARY OF THE INVENTION

It is therefore an object of the invention to provide a method for planarizing damascence structure. In the damascence planarizing process according to the invention, the disadvantages of the conventional process are improved.

To achieve these objects and advantages, and in accordance with the purpose of the invention, as embodied and broadly described herein, the invention is directed towards a damascence planarizing process. A dielectric layer is deposited over the wafer. A trench is then formed by defining the dielectric layer. Thereafter, a metal layer is deposited over the dielectric layer and fills the trench. An electrical polishing and a chemical mechanical polishing step are performed to remove the metal layer until the dielectric layer is exposed.

It is to be understood that both the foregoing general description and the following detailed description are exemplary and explanatory only and are not restrictive of the invention as claimed.

DESCRIPTION OF THE PREFERRED EMBODIMENTS

Figure 1A:
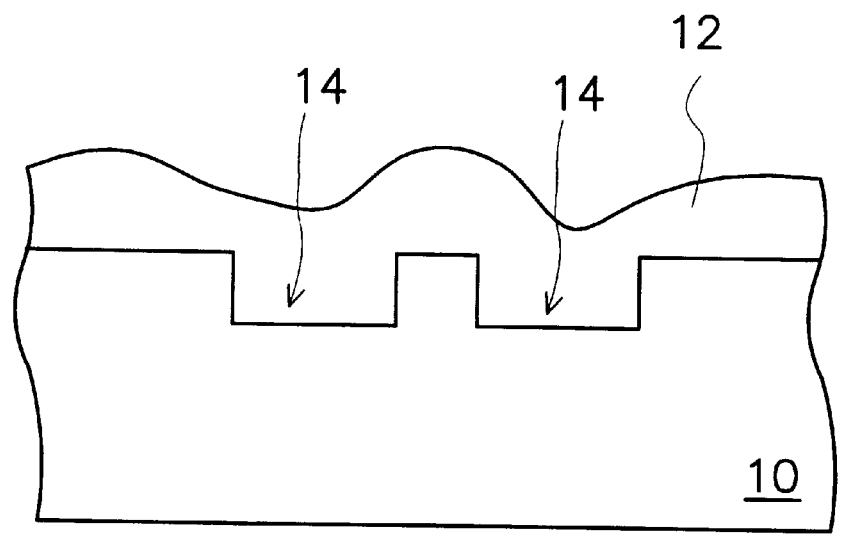
FIG. 1A to FIG. 1B show the cross sectional view of a conventional method for planarizing a damascence structure.
Figure 1B:
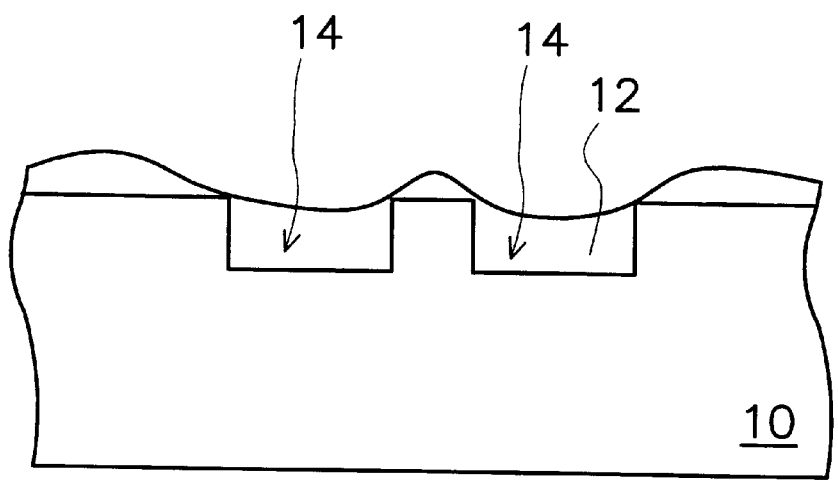
Figure 2A:
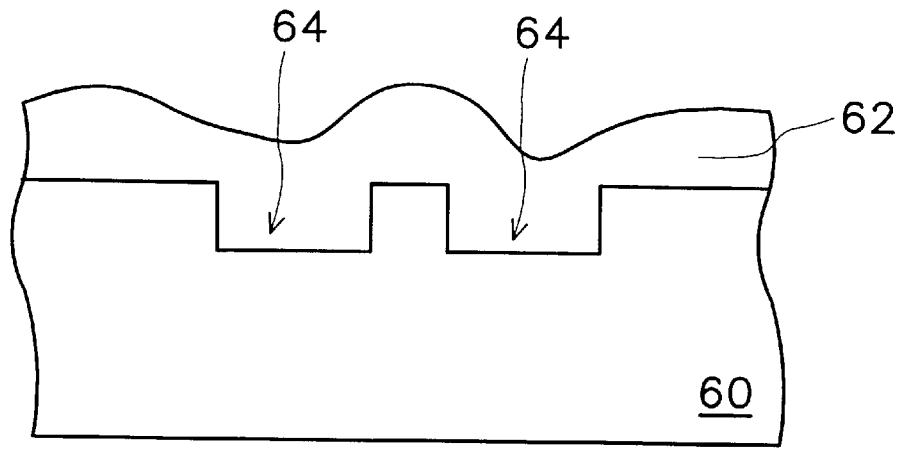
FIG. 2A to FIG. 2C are cross sectional views of a method for planarizing damascence structure in a preferred embodiment according to the invention.
Figure 2B:
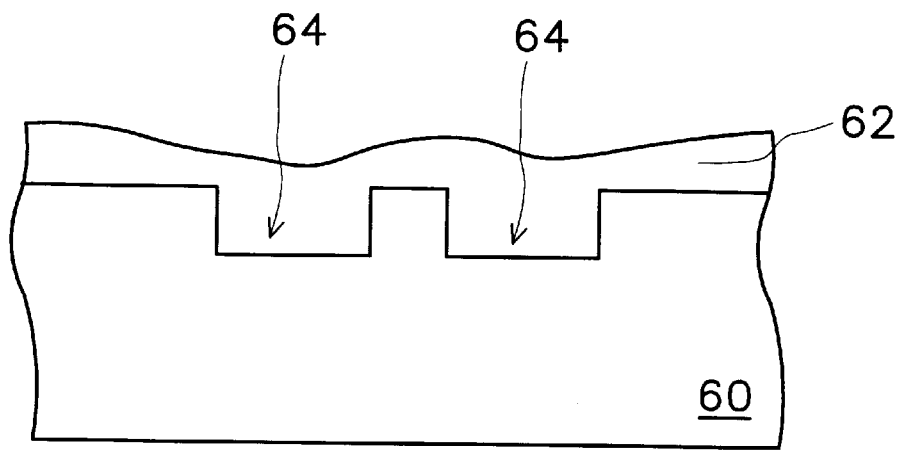
Figure 2C:
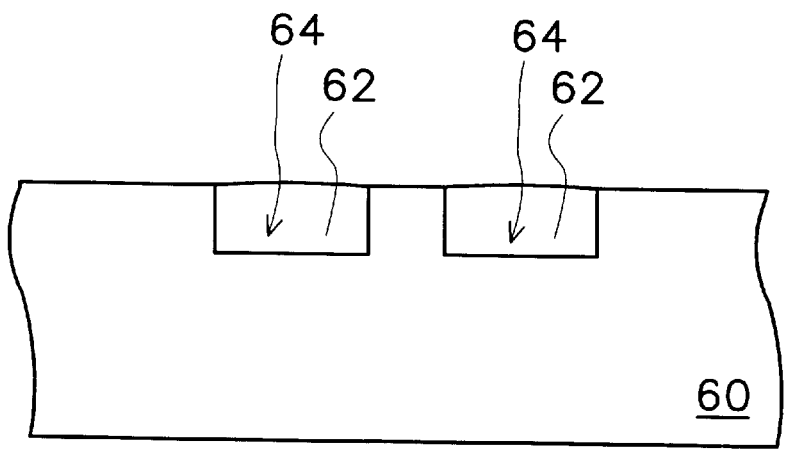

FIG. 2A to FIG. 2C are cross sectional views of a method for planarizing damascence structure in a preferred embodiment according to the invention.

Referring to FIG. 2A, on an outside portion of a wafer, such as a surface of a silicon substrate or a metal wiring, a dielectric layer 60 is formed. A preferable dielectric layer 60 includes a silicon oxide layer formed by plasma enhanced CVD (PECVD) with a temperature of about 300° C. to 400° C. and a pressure of about 0.1 torr to 5 torr. An opening 64, for example, contact opening, via opening or interconnect trench, is then formed on the dielectric layer 60. Thereafter, using a physical vapor deposition method to deposit conductive layer 62, for example, metal layer, over the dielectric layer 60 and fills the opening 64.

Figure 3:
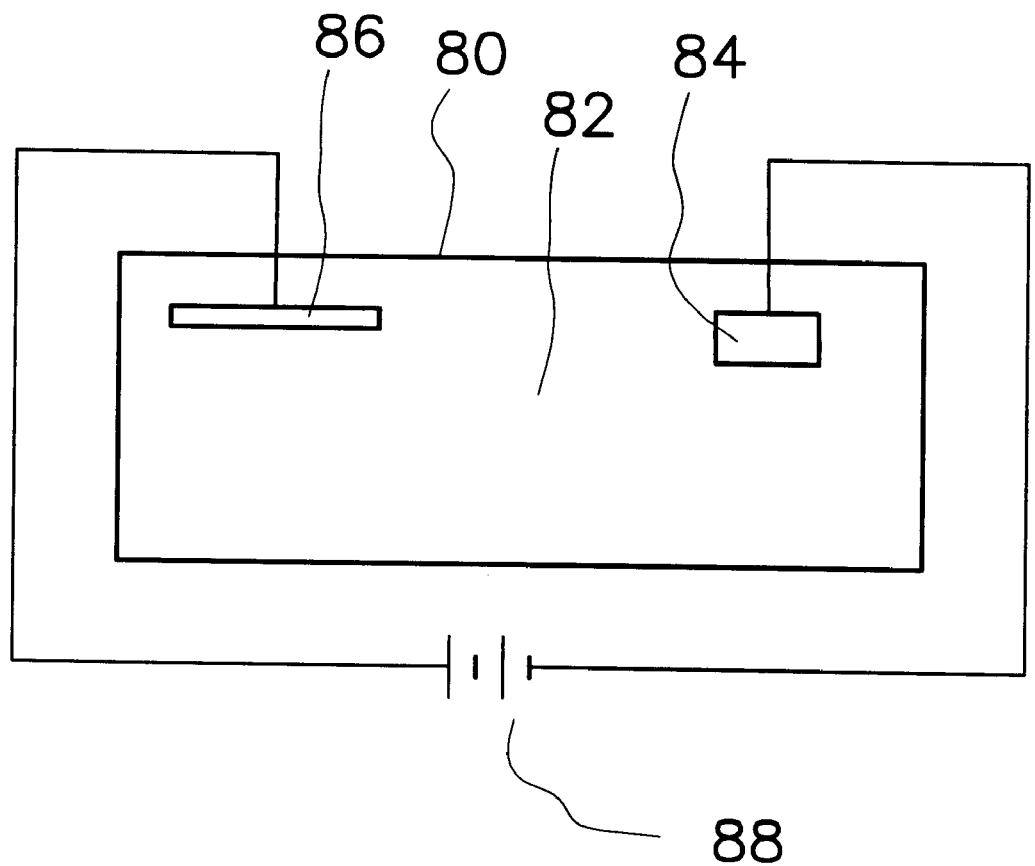
FIG. 3 is a diagram of an electrolytic cell.

Referring to FIG. 2B, using the electrolytic cell 80 (FIG. 3) an electrical polishing step is performed. The electrolytic cell 80 equipped with electrobath 82, anode 86 and cathode 84. The anode 86 and cathode 84 are dipped into the electrobath 82, and are connected to direct current power 88. The wafer is fixed on the anode 86, then a current is applied. The protuberant portions on the surface of the metal layer 62 have the rapidly electrolysis speed. Therefore, the unevenness on the surface of the metal layer 62 is reduced.

Referring to FIG. 2C, a polishing method, for example, a chemical mechanical polishing method, is then applied to plane the whole surface of the wafer, advantageously further plane the surface of the metal layer 62. The metal material of the metal layer 62 over the dielectric layer 60 is removed during the polishing process to complete the manufacture of the damascence structure.

The feature of the invention is that of using an electrical polishing method to remove most parts of the metal layer. The metal material of the metal layer is removed by an electrolysis procedure of the electrical polishing method. The removing speed of the metal layer is higher in the electrical polishing procedure than in the chemical mechanical polishing procedure. Therefore, the time period of the whole planarization procedure is reduced. Moreover, the electrolytic cell is capable of handling large amount of wafers at the same time. It is suitable for the large scale manufacturing procedure. Furthermore, after the electrical polishing process is performed, there is less unevenness occurred on the surface of the metal layer. Therefore, it is not easy for dishing and erosion occurred on the surface of the metal layer during the step of chemical mechanical polishing.

Other embodiments of the invention will appear to those skilled in the art from consideration of the specification and practice of the invention disclosed herein. It is intended that the specification and examples considered as exemplary only, with the true scope and spirit of the invention being indicated by the following claims.

What is claimed is:

1. A method for planarizing a damascene structure, comprising the steps of:

providing a substrate at least having a dielectric layer formed thereon;

defining the dielectric layer to form a plurality of openings;

depositing a metal layer over the dielectric layer and filling the openings, wherein a top surface of the metal layer has protuberant parts and is not planar;

performing an electrical polishing procedure on the top surface of the metal layer to remove the protuberant parts of the metal layer, so that the dielectric layer has a surface more planar than before electrical polishing; and performing a polishing process on the top surface of the metal layer to remove a portion of the metal layer over a top surface of the substrate and leave portions of the metal layer to fill the openings.

2. The method according to claim 1, wherein the dielectric layer is formed by a chemical vapor deposition method.

3. The method according to claim 1, wherein the openings are contact openings.

4. The method according to claim 1, wherein the openings are via openings.

5. The method according to claim 1, wherein the openings are interconnect trenchs.

6. The method according to claim 1, wherein the depositing step of the metal layer comprises using a physical vapor deposition method.

7. The method according to claim 1, wherein the performing step of the electrical polishing procedure comprises performing the electrical polishing procedure in an electrolytic cell.

* * * * *